(12) United States Patent
Chung et al.

(10) Patent No.: US 11,302,850 B2
(45) Date of Patent: Apr. 12, 2022

(54) DISPLAY DEVICE AND MANUFACTURING METHOD THEREOF

(71) Applicant: SAMSUNG ELECTRONICS CO., LTD., Suwon-si (KR)

(72) Inventors: Deukseok Chung, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 71 days.

(21) Appl. No.: 16/714,950

(22) Filed: Dec. 16, 2019

(65) Prior Publication Data

US 2020/0194633 A1 Jun. 18, 2020

(30) Foreign Application Priority Data

Dec. 18, 2018 (KR) .......................... 10-2018-0164051

(51) Int. Cl.
| | |
|---|---|
| *H01L 33/50* | (2010.01) |
| *H01L 25/075* | (2006.01) |
| *H01L 33/62* | (2010.01) |
| *H01L 33/44* | (2010.01) |

(52) U.S. Cl.
CPC ........ *H01L 33/504* (2013.01); *H01L 25/0753* (2013.01); *H01L 33/44* (2013.01); *H01L 33/505* (2013.01); *H01L 33/62* (2013.01); *H01L 2933/0041* (2013.01)

(58) Field of Classification Search
USPC .................................. 257/88–102, E33.001
See application file for complete search history.

(56) References Cited

U.S. PATENT DOCUMENTS

| | | | |
|---|---|---|---|
| 9,599,857 B2 * | 3/2017 | Bibl | ........................ H01L 33/50 |
| 9,971,076 B2 | 5/2018 | Park et al. | |
| 11,037,914 B2 * | 6/2021 | Kim | ........................ H01L 25/167 |
| 2014/0339495 A1 | 11/2014 | Bibl et al. | |
| 2014/0367633 A1 | 12/2014 | Bibl et al. | |

FOREIGN PATENT DOCUMENTS

| | | |
|---|---|---|
| KR | 1020160056335 A | 5/2016 |
| KR | 1020170061765 A | 6/2017 |

* cited by examiner

*Primary Examiner* — Bo B Jang
(74) *Attorney, Agent, or Firm* — Cantor Colburn LLP

(57) ABSTRACT

A method for manufacturing a display device includes: providing a plurality of light emitting elements on a substrate; providing a first photosensitive resin layer on the light emitting elements; driving a plurality of first light emitting elements among the plurality of light emitting elements, the driving of the plurality of first light emitting elements hardening a portion of the first photosensitive resin layer which corresponds to the plurality of first light emitting elements; and providing a first color converting layer as the portion of the first photosensitive resin layer which is hardened, by removing a remaining portion of the first photosensitive resin layer.

11 Claims, 10 Drawing Sheets

FIG. 1
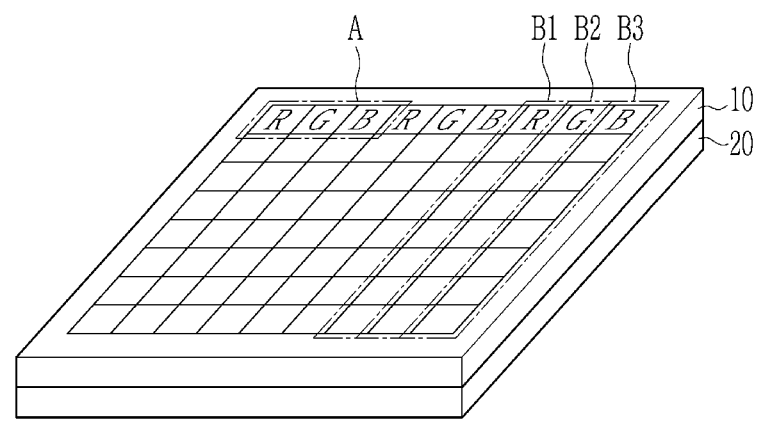
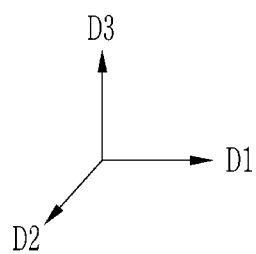

DISPLAY DEVICE AND MANUFACTURING METHOD THEREOF

CROSS-REFERENCE TO RELATED APPLICATION

This application claims priority to Korean Patent Application No. 10-2018-0164051 filed on Dec. 18, 2018, and all the benefits accruing therefrom under 35 U.S.C. § 119, the entire contents of which are incorporated herein by reference.

BACKGROUND

(a) Field

The invention relates to a display device and a manufacturing method thereof.

(b) Description of the Related Art

Display devices include a liquid crystal display ("LCD"), a plasma display panel, and an organic light emitting display ("OLED"). These display devices are driven by pixels individually generating red light, green light, blue light and/or white light (e.g., light-emitting type display device), or light generated by a light source passing through a color filter and thereby realize colors corresponding to the pixels. Among the display devices, color purity of the light-emitting type display device is relatively high so image quality may be excellent.

In contrast, the display device in which light from the light source passes through the color filter may be relatively easily manufactured and relatively large display devices may be realized. However, the color filter absorbs light passing therethrough, such that energy loss of light output from the display device is inevitable, a full width of half maximum of the finally output light is relatively wide, and luminance and color purity may be deteriorated.

SUMMARY

Elements and structures of a light-emitting type display device have different materials and characteristics for respective pixels. Accordingly, a manufacturing process of the light-emitting type display device may have a relatively high level of difficulty such that manufacturing relatively large display devices may also be difficult.

The invention provides a display device with relatively high optical efficiency, high color purity and color reproducibility.

The invention provides a method for manufacturing a display device for reducing process time and cost by providing a color converting layer and a transmission layer through a simplified process.

The technical object to be achieved by the invention is not limited to the aforementioned technical object, and other unmentioned technical objects will be obviously understood by those skilled in the art from the description below.

An exemplary embodiment of the invention provides a display device including: a plurality of light emitting element which emits incident light; a first color converting layer which color-converts the incident light; a second color converting layer which color-converts the incident light; and a transmission layer which transmits the incident light. The first color converting layer, the second color converting layer, and the transmission layer respectively correspond to a light emitting element among the plurality of light emitting elements, and the first color converting layer corresponds to a plurality of first light emitting elements among the plurality of light emitting elements, the plurality of first light emitting elements being electrically connected to each other The second color converting layer may correspond to a plurality of second light emitting elements among the plurality of light emitting elements, and the plurality of second light emitting elements may be electrically connected to each other.

The transmission layer may correspond to a plurality of third light emitting elements, and the plurality of third light emitting elements may be electrically connected to each other.

A planar area occupied by a single one light emitting element among the plurality of light emitting elements may be less than a planar area occupied by the first color converting layer.

The incident light emitted by the light emitting elements may have a Lambertian distribution.

A ratio of a width to a height of the first color converting layer may be about 4:1 to about 1:1.

Each of the plurality of light emitting elements may include: a first conductive semiconductor layer; a second conductive semiconductor layer facing the first conductive semiconductor layer; and an active layer between the first conductive semiconductor layer and the second conductive semiconductor layer.

The display device may further include a passivation layer respectively between the plurality of light emitting elements, and each of the first color converting layer, the second color converting layer and the transmission layer.

Another embodiment of the invention provides a method for manufacturing a display device including: providing a plurality of light emitting element on a substrate; providing a first photosensitive resin layer on the light emitting elements; driving a plurality of first light emitting elements among the plurality of light emitting elements, the driving of the plurality of first light emitting elements hardening a portion of the first photosensitive resin layer which corresponds to the plurality of first light emitting elements; and providing a first color converting layer as the portion of the first photosensitive resin layer which is hardened, by removing a remaining portion of the first photosensitive resin layer.

The method may further include providing a second photosensitive resin layer on the plurality of light emitting elements and on the first color converting layer; driving a plurality of second light emitting elements among the plurality of light emitting elements, the driving of the plurality of second light emitting elements hardening a portion of the second photosensitive resin layer which corresponds to the plurality of second light emitting elements; and providing a second color converting layer as the portion of the second photosensitive resin layer which is hardened, by removing a remaining portion of the second photosensitive resin layer.

The method may further include providing a third photosensitive resin layer on the plurality of light emitting elements, the first color converting layer and the second color converting layer; driving a plurality of third light emitting elements among the plurality of light emitting elements, the driving of the plurality of third light emitting elements hardening a portion of the third photosensitive resin layer which corresponds to the plurality of third light emitting elements; and providing a transmission layer as the portion of the third photosensitive resin layer which is hardened, by removing a remaining portion of the third photosensitive resin layer.

The method may further include providing a third photosensitive resin layer on the plurality of light emitting elements, the first color converting layer and the second color converting layer; and providing a transmission layer as a hardened portion of the third photosensitive resin layer which corresponds to each of the plurality of light emitting elements, the first color converting layer and the second color converting layer.

A group of light emitting elements among the plurality of light emitting elements may be arranged along a single one direction and may be electrically connected to each other.

The plurality of first light emitting elements may correspond to the first color converting layer and may be electrically connected to each other, the plurality of second light emitting elements may correspond to the second color converting layer and may be electrically connected to each other, and the plurality of third light emitting elements may correspond to the transmission layer and may be electrically connected to each other.

A center wavelength of the light output by the light emitting elements may be about 430 nanometers to about 470 nanometers.

The first photosensitive resin layer and the second photosensitive resin layer may include a photoinitiator activated at the center wavelength.

The first photosensitive resin layer may include a first semiconductor nanocrystal, and the second photosensitive resin layer may include a second semiconductor nanocrystal.

According to one or more embodiment of the invention, the color converting layer may be provided without an additional exposure apparatus, thereby reducing manufacturing cost and time used in manufacturing a display device. A light source for providing the color converting layer emits light from the bottom (e.g., an interface between the color converting layer and a passivation layer), in a process for providing a color converting layer and a transmission layer, so adherence of the color converting layer to other layers within the display device may be excellent. Providing the color converting layer as discrete patterns may be relatively easy according to the simplified process.

BRIEF DESCRIPTION OF THE DRAWINGS

The above and other advantages and features of this disclosure will become more apparent by describing in further detail exemplary embodiments thereof with reference to the accompanying drawings, in which:

FIG. 1 shows a perspective view of a display device according to an exemplary embodiment.

DETAILED DESCRIPTION

Figure 2:
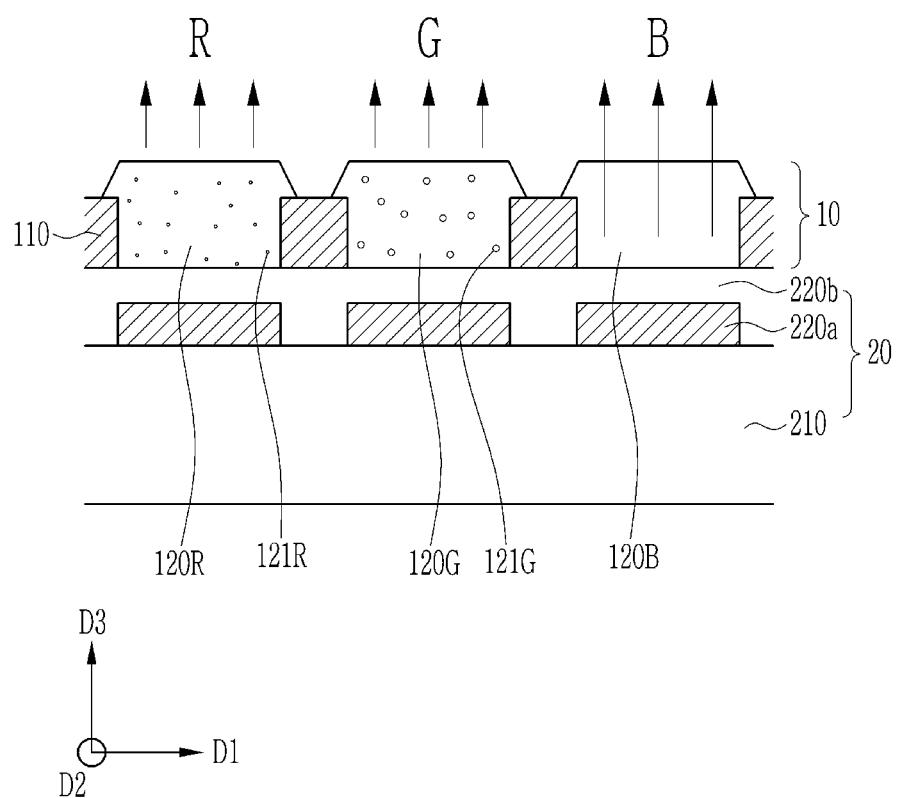
FIG. 2 and FIG. 3 respectively show a cross-sectional view of a display device according to an exemplary embodiment.

Exemplary embodiments of the invention will be described in detail with reference to the accompanying drawings. In describing the invention, a description of known functions or configurations will be omitted so as to make the subject matter of the invention more clear.

To clearly describe the invention, portions which do not relate to the description are omitted, and like reference numerals designate like elements throughout the specification. The size and thickness of each component shown in the drawings are arbitrarily shown for better understanding and ease of description, but the invention is not limited thereto.

In the drawings, the thickness of layers, films, panels, regions, etc., are exaggerated for clarity. For better understanding and ease of description, the thickness of some layers and areas are exaggerated.

It will be understood that when an element such as a layer, film, region, or substrate is referred to as being related to another element such as being "on" another element, it can be directly on the other element or intervening elements may also be present. In contrast, when an element such as a layer, film, region, or substrate is referred to as being related to another element such as being "directly on" another element, no intervening elements are present.

Figure 3:
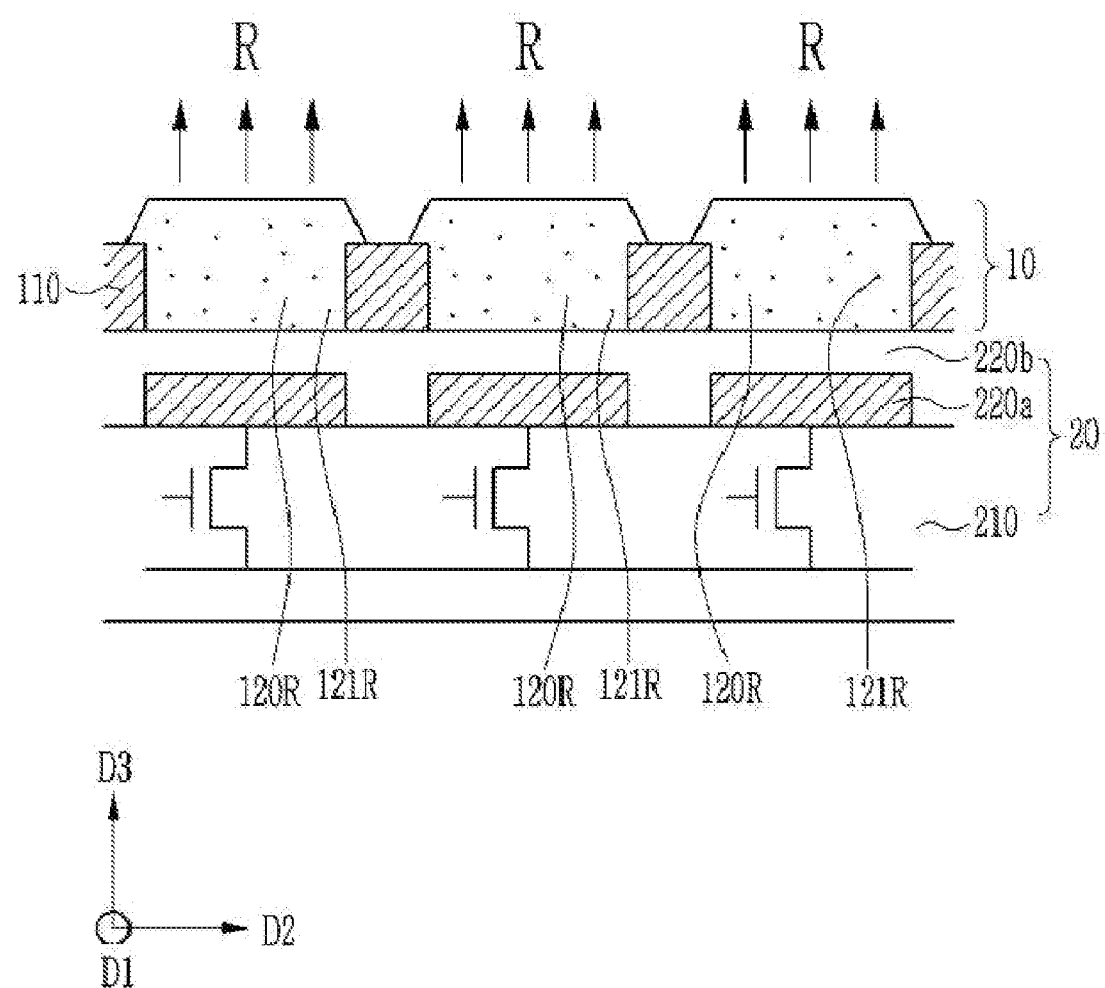

An exemplary embodiment of a display device will now be described with reference to FIG. 1 through FIG. 3. FIG. 1 is a perspective view of an exemplary embodiment of a display device, and FIG. 2 and FIG. 3 are enlarged cross-sectional views of exemplary embodiments of a display device.

Referring to FIG. 1, the display device may include a display panel 20 and a color converting panel 10 which is provided on the display panel 20. The display panel 20 and the color converting panel 10 may be disposed in a plane defined by a first direction D1 and a second direction D2 which cross each other. A thickness of the display panel 20, the color converting panel 10, and elements thereof, is defined along a third direction D3 which crosses each of the first direction D1 and the second direction D2.

The display device may selectively output red (R) light, green (G) light, and blue (B) light. The display panel 20 may be bonded to the color converting panel 10 and may form an interface therebetween. A pixel provided in plurality (e.g., a plurality of pixels) arranged in the second direction D2 may output a same color light. In an exemplary embodiment, for example, a plurality of pixels provided along the second direction D2 within group B1 may each output red light, a plurality of pixels provided along the second direction D2 within group B2 may each output green light, and a plurality of pixels provided along the second direction D2 within group B3 may each output blue light.

In an exemplary embodiment, a plurality of pixels included within group B1 may be electrically connected to each other, a plurality of pixels included within group B2 may be electrically connected to each other, and a plurality of pixels included within group B3 may be electrically connected to each other. This will now be described in detail.

The display panel 20 may include a light emitting element such as a light emitting element package 220a (refer to FIG. 2) provided in plurality (e.g., a plurality of light emitting elements or a plurality of light emitting element packages 220a) arranged in a matrix form. Each light emitting element package 220a may correspond to or define a pixel. Referring to FIG. 1, the light emitting element packages 220a are arranged in a 8×9 matrix for ease of description, without being limited thereto. In exemplary embodiments, the light emitting element packages 220a may be arranged in a larger number matrix (e.g., 1024×768 or 1920×1080) according to a resolution of the display device.

In exemplary embodiments, the display panel 20 may include a driver (not shown) for supplying power to the respective light emitting element packages 220a and a controller for controlling the light emitting element packages 220a.

Following descriptions will now be provided based on FIG. 2 as an enlarged cross-sectional view corresponding to a portion A of FIG. 1 taken along the first direction D1 and FIG. 3 as an enlarged cross-sectional view corresponding to a portion of group B1 of FIG. 1 taken along the second direction D2.

Referring to FIG. 2 and FIG. 3, the display panel 20 may include a substrate 210, a light emitting element package 220a which is provided on the substrate 210, and a passivation layer 220b which is provided on the light emitting element package 220a.

The substrate 210 may be a transparent substrate. In an exemplary embodiment, for example, the substrate 210 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$). The substrate 210 may be omitted in an exemplary embodiment.

The light emitting element package 220a which generates and/or emits blue light may be provided on the substrate 210. The light emitting element package 220a may generate and/or emit light by a power signal and/or a driving signal applied thereto. In an exemplary embodiment, for example, the light emitting element package 220a may include a semiconductor light emitting chip such as a light emitting diode ("LED"). A detailed stacking structure of the plurality of light emitting element packages 220a will be described with reference to FIG. 5.

A center wavelength of the light emitted by the light emitting element package 220a may be about 430 nanometers to about 470 nanometers, for example, about 440 nanometers to about 460 nanometers.

A pitch between adjacent light emitting element packages 220a may be equal to or less than about 100 micrometers. That is, a distance between the centers may be equal to or less than about 100 micrometers with respect to two adjacent light emitting element packages 220a.

A plurality of light emitting element packages 220a may be electrically connected to each other. As described with reference to FIG. 1, a plurality of first light emitting element packages 220a arranged along the second direction D2 within the group B1, that is, a plurality of first light emitting element packages 220a overlapping a first color converting layer 120R which color-converts an incident light to a first color light, may be electrically connected to each other. A plurality of second light emitting element packages 220a arranged along the second direction D2 within the group B2, that is, a plurality of second light emitting element packages 220a overlapping a second color converting layer 120G which color-converts an incident light to a second color light, may be electrically connected to each other. A plurality of third light emitting element packages 220a arranged along the second direction D2 within the group B3, that is, a plurality of third light emitting element packages 220a overlapping a transmission layer 120B, may be electrically connected to each other.

As shown with reference to FIG. 3, a plurality of light emitting element packages 220a arranged along the second direction D2 within the group B1 may include drain electrodes electrically connected to each other. This is also applicable to the light emitting element packages 220a provided in the group B2 and group B3. FIG. 3 is an enlarged cross-sectional view of a display device and shows a transistor circuit for efficient understanding of a structure of a light emitting element package 220a within the display device.

By the above-noted connection, the light emitting element packages 220a provided in an area of pixels (e.g., within the group B1, the group B2 or the group B3 of multiple pixels) that emits the same color may be driven simultaneously. A configuration is described in which the drain electrodes are connected with each other, and without being limited to this, a plurality of light emitting element packages 220a which are driven simultaneously, may be connected to each other by various connections (e.g., by conductive wires).

The passivation layer 220b may be provided on the light emitting element package 220a. The passivation layer 220b may include or be made of an inorganic material or an organic material. When the passivation layer 220b includes an inorganic material, the inorganic material may include a silicon oxide or a silicon nitride. The passivation layer 220b may cover a plurality of light emitting element packages 220a and may planarize upper sides of the same to provide a relatively flat surface of the passivation layer 220b.

The color converting panel 10 may be provided on the display panel 20, in a direction in which light is emitted (e.g., in the third direction D3). The color converting panel 10 may omit an additional or separate substrate therein, and may include constituent elements provided on the display panel 20 within the display device.

A light blocking member 110 may be provided on the passivation layer 220b. The light blocking member 110 may have a lattice form extending in both the first direction D1 and the second direction D2. In detail, along the second direction D2, the light blocking member 110 may be provided between the first color converting layer 120R and the second color converting layer 120G, between the second color converting layer 120G and the transmission layer 120B, and between the transmission layer 120B and the first color converting layer 120R. Along the first direction D1, the light blocking member 110 may also be provided between first color converting layers 120R adjacent to each other, between second color converting layers 120G adjacent to each other, and between transmission layers 120B adjacent to each other.

The light blocking member 110 may reduce or effectively prevent mixing of different lights emitted by adjacent pixels and may partition the area in which a plurality of color converting layers 120R and 120G and a transmission layer 120B are disposed. FIG. 2 and FIG. 3 show the light blocking member 110 having an upper surface furthest from the substrate 210 which is closer to the substrate 210 (e.g., lower than) an upper surface of each of the first color converting layer 120R, the second color converting layer 120G, and the transmission layer 120B, without being limited thereto. In an alternative exemplary embodiment, an upper surface of the light blocking member 110 which is furthest from the substrate 210, may be disposed a substantially same distance (e.g., equivalent height) from the substrate 210 as the upper surface of each of the first color converting layer 120R, the second color converting layer 120G, and the transmission layer 120B.

The first color converting layer 120R, the second color converting layer 120G, and the transmission layer 120B may be repeatedly disposed along the first direction D1.

The first color converting layer 120R and the second color converting layer 120G each color-converts light incident thereto from the display panel 20 and outputs resultant color-converted light. The transmission layer 120B outputs incident light thereto from the display panel 20, without color-converting the same. In an exemplary embodiment, for example, blue light may be incident into the transmission layer 120B and the blue light may be output therefrom.

The first color converting layer 120R may include a first semiconductor nanocrystal 121R (e.g., first color-converting element). The first semiconductor nanocrystal 121R may color-convert incident blue light into red light. The second color converting layer 120G may include a second semiconductor nanocrystal 121G (e.g., a second color-converting element). The second semiconductor nanocrystal 121G may color-convert incident blue light into green light.

The first semiconductor nanocrystal 121R and the second semiconductor nanocrystal 121G may respectively include a quantum dot. The quantum dot may be selected from among a group II-VI compound, a group III-V compound, a group IV-VI compound, a group IV element, a group IV compound, and a combination thereof.

The Group II-VI compound may be selected from among a binary compound selected from among CdSe, CdTe, ZnS, ZnSe, ZnTe, ZnO, HgS, HgSe, HgTe, MgSe, MgS, and a combination thereof; a tertiary compound selected from among CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combintation thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound may be selected from among a binary compound selected from among GaN, GaP, GaAs, GaSb, AlN, AlP, AlAs, AlSb, InN, InP, InAs, InSb, and a combination thereof; a tertiary compound selected from among GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary compound selected from among GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a combination thereof. The Group IV-VI compound may be selected from among a binary compound selected from among SnS, SnSe, SnTe, PbS, PbSe, PbTe, and a combination thereof; a tertiary compound selected from among SnSeS, SnSeTe, SnSTe, PbSeS, PbSeTe, PbSTe, SnPbS, SnPbSe, SnPbTe, and a combination thereof; and a quaternary compound selected from among SnPbSSe, SnPbSeTe, SnPbSTe, and a combination thereof. The Group IV element may be selected from among Si, Ge, and a combination thereof. The Group IV compound may be a binary compound selected from among SiC, SiGe, and a combination thereof.

The binary compound, the tertiary compound, or the quaternary compound may exist in particles at a uniform concentration, or may exist in the same particle divided into states where concentration distributions partially differ.

Further, the color-converting element (e.g., color conversion media layer) may have a core/shell structure where one quantum dot surrounds another quantum dot. An interface between the core and the shell may have a concentration gradient such that a concentration of an element existing in the shell is gradually reduced nearing the center thereof.

The quantum dot may have a full width at half maximum ("FWHM") of an emission wavelength spectrum of about 45 nanometers (nm) or less, about 40 nm or less, or about 30 nm or less, with which color purity or color reproducibility may be improved. Also, the light emitted through the quantum dot is irradiated in substantially all directions, thereby improving a light viewing angle.

The quantum dot may be commercially available or may be synthesized by any of a number of methods. In an exemplary embodiment, the quantum dot may be a colloidal particle synthesized by a wet chemical process. The wet chemical process grows crystal particles by a reaction of precursor materials from among an organic solvent, and in this instance, the organic solvent or the ligand compound is naturally provided on a surface of the quantum dot to control the growth of crystal. In the wet chemical process, a recovery of the synthesized colloidal quantum dot may include adding a non-solvent to a reaction solution, and centrifuging a final mixture. The recovery process may remove at least part of an organic material provided on the surface of the quantum dot. The non-solvent includes acetone, ethanol, and methanol, and it is not limited thereto.

The quantum dot may have an organic ligand combined to a surface thereof. In an exemplary embodiment, the organic ligand may have a hydrophobic moiety. The organic ligand may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (here, R and R' are independently hydrogen and a C5 to C24 substituted or unsubstituted aliphatic hydrocarbon group, for example, a C5 to C24 alkyl group, a C5 to C24 alkenyl group, or a C5 to C20 aromatic hydrocarbon group, for example, a C6 to C20 aryl group, and at least one thereof is not hydrogen), or a combination thereof.

Examples of the organic ligand may include thiol compounds such as methane thiol, ethane thiol, propane thiol, butane thiol, pentane thiol, hexane thiol, octane thiol, dodecane thiol, hexadecane thiol, octadecane thiol, benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octyl phosphine, dioctyl phosphine, tributyl phosphine, or trioctyl phosphine; phosphine compounds or their oxide compounds such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphineoxide, trioctyl phosphineoxide; diphenyl phosphine, triphenyl phosphine compound or oxide compounds thereof; C5 to C20 (mono- or di) alkylphosphinic acids such as (mono- or di) hexylphosphinic acid, (mono- or di) octylphosphinic acid, (mono- or di) dodecanephosphinic acid, (mono- or di) tetradecanephosphinic acid, (mono- or di) hexadecanephosphinic acid, (mono- or di) octadecanephosphinic acid; and C5 to C20 alkyl phosphonic acids such as hexylphosphonic acid, octylphosphonic acid, dodecanephosphonic acid, tetradecanephosphonic acid, hexadecanephosphonic acid, or octadecanephosphonic acid, and are not limited thereto The quantum dot may include the organic ligand alone or as a combination thereof.

When the first semiconductor nanocrystal 121R includes a red phosphor, the red phosphor may include at least one selected from among $(Ca, Sr, Ba)S$, $(Ca, Sr, Ba)_2Si_5N_8$, $CaAlSiN_3$, $CaMoO_4$, and $Eu_2Si_5N_8$, and is not limited thereto.

When the second semiconductor nanocrystal 121G includes a green phosphor, the green phosphor may include at least one selected from among yttrium aluminum garnet (YAG), (Ca, Sr, Ba)$_2$SiO$_4$, SrGa$_2$S$_4$, barium magnesium aluminate (BAM), α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, and is not limited thereto. The x may be a random number between 0 and 1.

The transmission layer 120B may allow the incident light to pass through without color-conversion. The transmission layer 120B may include a resin through which the blue light transmits. The transmission layer 120B provided in an area or region outputting a blue color light does not include an additional semiconductor nanocrystal, and allows the incident blue light to pass through without color-conversion.

Although not shown, the transmission layer 120B may further include a dye and/or a pigment. The transmission layer 120B including a dye or a pigment may reduce the reflection of external light incident thereto, and may output blue light therefrom with improved color purity.

At least one of the first color converting layer 120R, the second color converting layer 120G, and the transmission layer 120B may further include a light scatterer (not shown). Contents of the light scatterer included in the first color converting layer 120R, the second color converting layer 120G, and the transmission layer 120B may be different from each other. The light scatterer may increase the amount of light converted by the first color converting layer 120R and the second color converting layer 120G, and transmitted through the transmission layer 120B, and then output, and may uniformly provide front luminance and lateral luminance of the display device.

The scatterer may include any of a number of materials for uniformly scattering the incident light. The scatterer may exemplarily include at least one of TiO$_2$, ZrO$_2$, Al$_2$O$_3$, In$_2$O$_3$, ZnO, SnO$_2$, Sb$_2$O$_3$, and ITO.

The first color converting layer 120R, the second color converting layer 120G, and the transmission layer 120B may exemplarily include a photosensitive resin, and may be provided or formed according to a photolithography process. A manufacturing method of a display device will now be described with reference to FIG. 6 through FIG. 10.

A planar area occupied by the first color converting layer 120R, the second color converting layer 120G, and the transmission layer 120B may be greater than a planar area occupied by the light emitting element packages 220a. That is, a planar area occupied by a single one of the light emitting element package 220a is less than a planar area occupied by the first color converting layer 120R. Referring to FIG. 3, for example, a dimension along the first direction D1 may be used to relatively represent a planar area of both a single one of the light emitting element package 220a and a planar area of the first color converting layer 120R, such that a width of the single one of the light emitting element package 220a is less than a width of the first color converting layer 120R. The same descriptions for the light emitting element package 220a and the first color converting layer 120R, may also be applied to a single one of the light emitting element package 220a and the second color converting layer 120G and/or the transmission layer 120B.

Light output by the light emitting element package 220a (e.g., incident light to the color converting panel 10) may have a Lambertian distribution. Blue light as incident light having the Lambertian distribution may be input with a relatively bigger area and a relatively bigger output area.

A respective width of the first color converting layer 120R, the second color converting layer 120G, and the transmission layer 120B may be defined along the first direction D1 and/or the second direction D2. A respective height (or thickness) of the first color converting layer 120R, the second color converting layer 120G, and the transmission layer 120B may be defined along the third direction D3. The height may be a distance between a lower surface closest to the substrate 210 and an upper surface furthest from the substrate 210, along the third direction D3.

Ratios of width versus height (or thickness) of the first color converting layer 120R, the second color converting layer 120G, and the transmission layer 120B may be about 4:1 to 1:1. Such ratios may be applied to maximum values of the width and the height (or thickness) described above, without being limited thereto. When the ratios of width versus height of the first color converting layer 120R, the second color converting layer 120G, and the transmission layer 120B increase to 1:1, a relatively narrow width of the first color converting layer 120R, second color converting layer 120G and transmission layer 120B may be possible. That is, a precise patterning of the first color converting layer 120R, second color converting layer 120G and transmission layer 120B as a discrete pattern may be possible. Taking FIG. 2 and FIG. 3 together, for example, the first color converting layer 120R, second color converting layer 120G and transmission layer 120B may each have a defined width along both the first direction D1 and the second direction D2, to define a discrete pattern.

Figure 4:
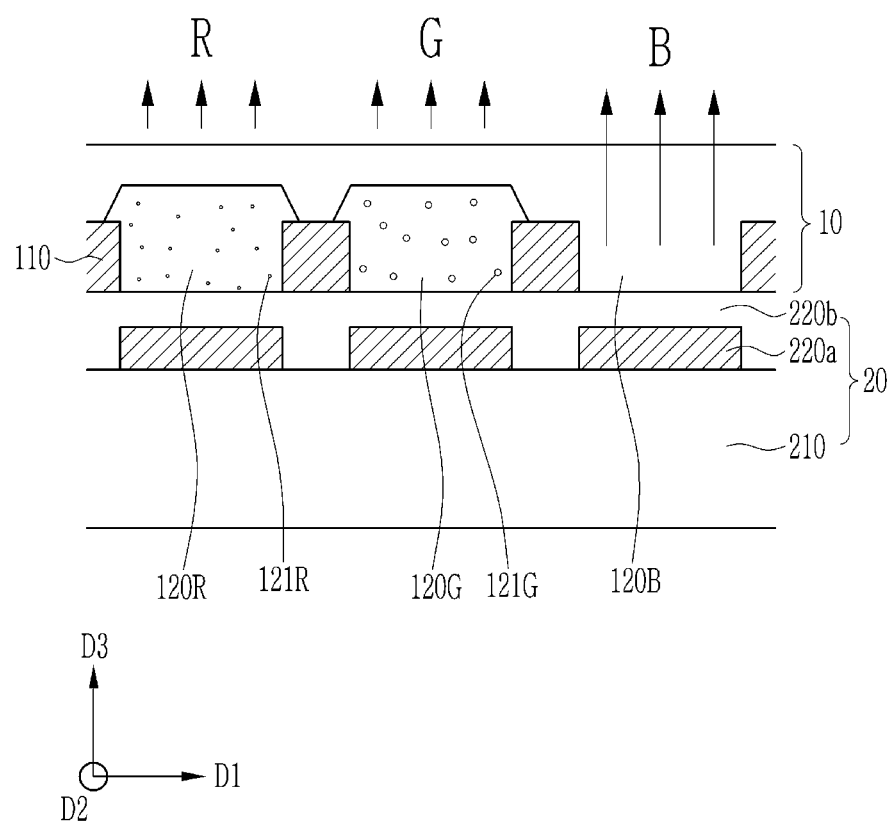
FIG. 4 shows a cross-sectional view of a display device according to an exemplary embodiment.

FIG. 4 is an enlarged cross-sectional view of another exemplary embodiment of a display device. Same constituent elements as the above-described constituent elements will not be described.

Referring to FIG. 4, the transmission layer 120B may overlap a side of the substrate 210. Taking FIG. 1 and FIG. 4 together, for example, the color converting panel 10 extends to a side of the display panel 20. That is, the transmission layer 120B of the color converting panel 10 may extend to an edge of the substrate 210 of the display panel 20, such that sides (or side surfaces) of the transmission layer 120B and the substrate 210 may overlap each other or coincide with each other (e.g., be aligned), without being limited thereto.

In detail, the transmission layer 120B may include a transparent resin. The transmission layer 120B including a transparent material may commonly cover the first color converting layer 120R and the second color converting layer 120G. That is, the transmission layer 120B may extend from an area at which blue light is output, to correspond to areas in which red light and green light are output from the color converting panel 10.

A first portion of the transmission layer 120B overlapping the light emitting element package 220a with no color converting layer therebetween, and not overlapping the first color converting layer 120R and the second color converting layer 120G, may emit blue light. A second portion of the transmission layer 120B overlapping the first color converting layer 120R and the second color converting layer 120G may planarize the first color converting layer 120R and the second color converting layer 120G and provide a substantially flat surface of the color converting panel 10. Referring to FIG. 4, the upper surface of the transmission layer 120B may provide a light emission surface of the color converting panel 10. When the display device includes the transmission layer 120B as shown in FIG. 4, an additional planarization process for layers of the color converting panel 10 may be omitted, such that a manufacturing process may be simplified. Furthermore, when the display device includes the transmission layer 120B as shown in FIG. 4, stacking of additional constituent elements of the display device on the transmission layer 120B and the color converting layers 120R and 120G may be more easily provided.

Figure 5:
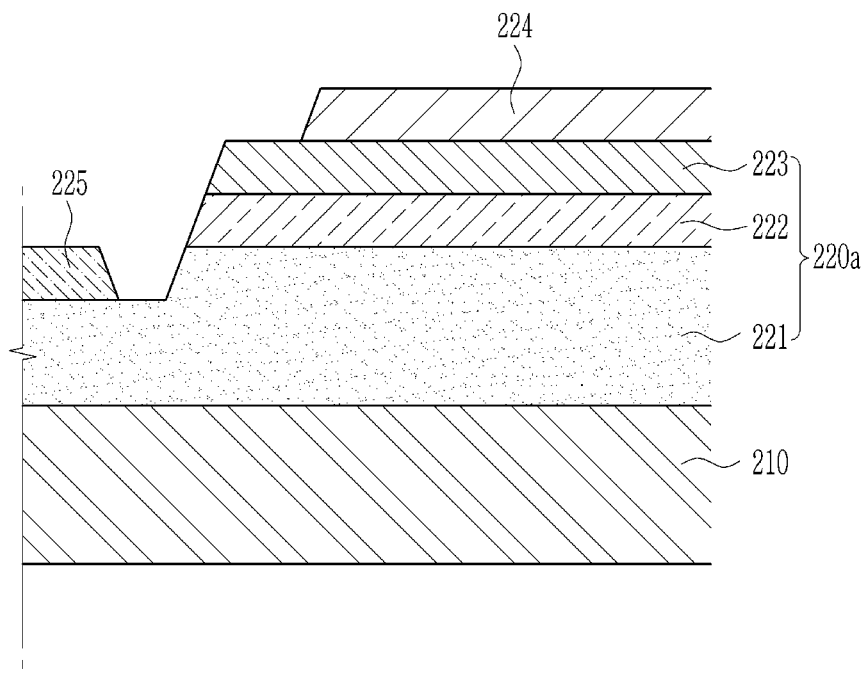
FIG. 5 shows a cross-sectional view of constituent elements of a display panel according to an exemplary embodiment.

A light emitting element package 220a of a display panel 20 will now be described with reference to FIG. 5. FIG. 5 is an enlarged cross-sectional view of a light emitting element package 220a relative to the display panel 20.

The display panel 20 may include a first conductive semiconductor layer 221 provided on the substrate 210, an active layer 222 provided on the first conductive semiconductor layer 221, and a second conductive semiconductor layer 223 provided on the active layer 222.

The first conductive semiconductor layer 221 may be an n-type semiconductor layer, and the second conductive semiconductor layer 223 may be a p-type semiconductor layer. The first conductive semiconductor layer 221 and the second conductive semiconductor layer 223 may include a nitride semiconductor. The first conductive semiconductor layer 221 and the second conductive semiconductor layer 223 may have a composition formula of $Al_xIn_yGa_{(1-x-y)}N$ (here, $0 \leq x \leq 1$, $0 \leq y \leq 1$, and $0 \leq x+y \leq 1$). The first conductive semiconductor layer 221 and the second conductive semiconductor layer 223 may include at least one material selected from among GaN, AlGaN, and InGaN. In an exemplary embodiment, the first conductive semiconductor layer 221 may include an n-type doped nitride semiconductor material, and the second conductive semiconductor layer 223 may include a p-type doped nitride semiconductor material. In an exemplary embodiment, for example, the first conductive semiconductor layer 221 may include an n-type doped GaN, and the second conductive semiconductor layer 223 may include a p-type doped GaN.

The active layer 222 emits light having predetermined energy by a recombination of electrons and holes. The active layer 222 may include or be formed with a multiple quantum wall ("MQW") structure in which a quantum wall layer and a quantum barrier layer are alternately stacked. The multiple quantum wall structure may have an InGaN/GaN structure, and the first conductive semiconductor layer 221, the active layer 222, and the second conductive semiconductor layer 223 may be epitaxial layers.

In exemplary embodiments, the light emitting element package 220a may be provided or formed by a metal-organic chemical vapor deposition ("MOCVD") process, a hydride vapor phase epitaxy ("HVPE") process, or a molecular beam epitaxy ("MBE") process.

Although not shown, a nitride semiconductor thin film may be provide between the substrate 210 and the light emitting element package 220a. The nitride semiconductor thin film may function as a buffer layer for reducing a lattice mismatch between the substrate 210 and the first conductive semiconductor layer 221.

Within the light emitting element package 220a, the first conductive semiconductor layer 221 may be connected to a first electrode 225, and the second conductive semiconductor layer 223 may be connected to a second electrode 224. The first electrode 225 and the second electrode 224 are separated from each other and do not contact each other.

The first electrode 225 and the second electrode 224 may include or be made of a metal with relatively high reflectivity in a wavelength range of light emitted by the light emitting element package 220a or an alloy of the metal. The first electrode 225 and the second electrode 224 may include a material selected from among Au, Sn, Ni, Pb, Ag, In, Cr, Ge, Si, Ti, W, and Pt, a layer made of an alloy including at least two materials selected from among them, or a multi-layer including a combination thereof.

A method for manufacturing a display device will now be described with reference to FIG. 6 through FIG. 10. FIG. 6, FIG. 7, FIG. 8, FIG. 9, and FIG. 10 respectively show enlarged cross-sectional views of structures in an exemplary embodiment of a method for manufacturing a display device. Same constituent elements as the above-described constituent elements will not be described.

Figure 6:
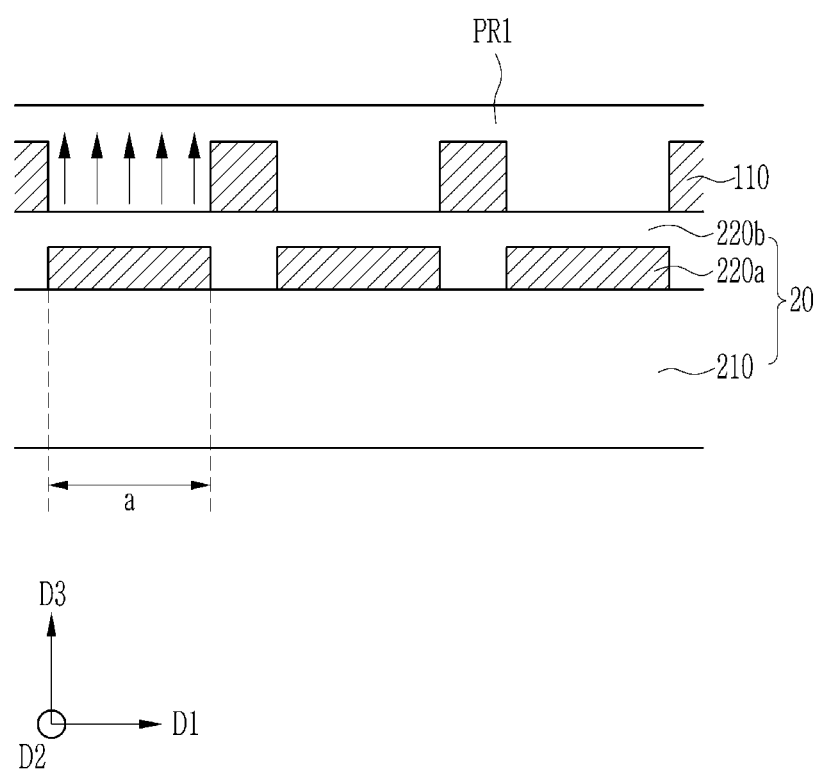
FIG. 6, FIG. 7, FIG. 8, FIG. 9, and FIG. 10 respectively show a cross-sectional view on a method for manufacturing a display device according to an exemplary embodiment.

Referring to FIG. 6, a light emitting element package 220a and a passivation layer 220b are provided or formed on a substrate 210. A light blocking member 110 is provided or formed on the passivation layer 220b.

A first photosensitive resin layer PR1 for covering the passivation layer 220b and the light blocking member 110 is provided or formed on the passivation layer 220b and the light blocking member 110. The first photosensitive resin layer PR1 may be commonly provided in each of the light emitting element packages 220a, the passivation layer 220b and the light blocking member 110. Other photosensitive resin layers described herein may also be commonly provided on underlying elements previously provided on the substrate 210.

The light emitting element package 220a provided in or defining a first area (a) of the substrate 210 is driven to generate and/or emit light (e.g., upward arrows in FIG. 6 at area (a)). In an exemplary embodiment, blue light may be emitted by the light emitting element package 220a, and particularly, the emitted light may have a center wavelength of about 430 nanometers to about 470 nanometers.

The first photosensitive resin layer PR1 overlapping the first area (a) of the substrate 210 may be hardened by the driving of the light emitting element package 220a provided in the first area (a) of the substrate 210.

The first photosensitive resin layer PR1 may include a photoinitiator which is activated by the light having a center wavelength. The first photosensitive resin layer PR1 may be a negative photosensitive resin, and the first photosensitive resin layer PR1 may include a first semiconductor nanocrystal 121R.

Figure 7:
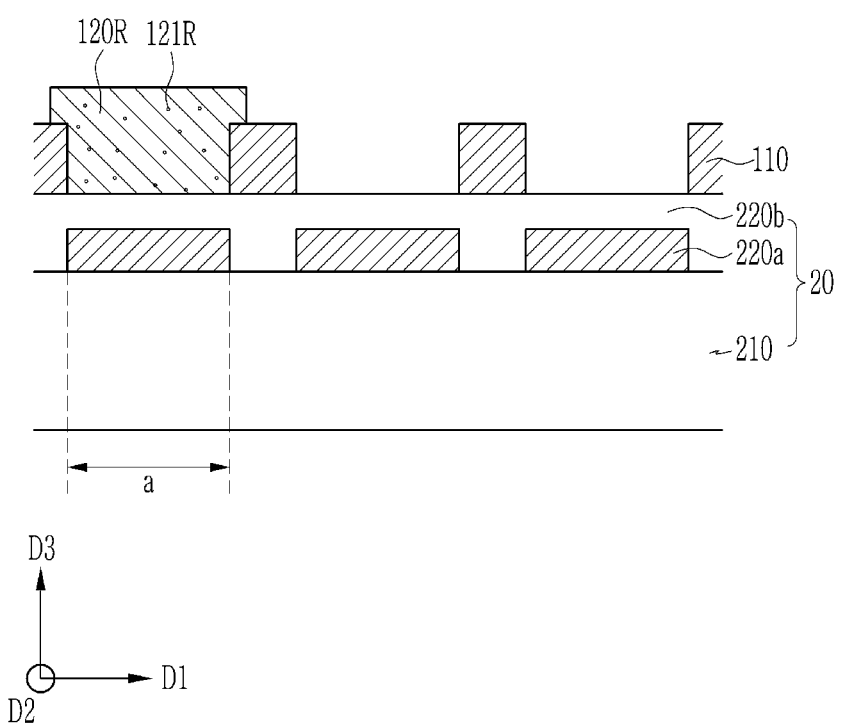

At the first area (a) of the substrate 210, the first color converting layer 120R may be provided or formed from a portion of the first photosensitive resin layer PR1 which is hardened, as shown in FIG. 7, by removing an un-hardened portion of the first photosensitive resin layer PR1. The un-hardened portion of the first photosensitive resin layer PR1 may be a remaining portion thereof except for the hardened portion. The first color converting layer 120R may include a first semiconductor nanocrystal 121R.

Figure 8:
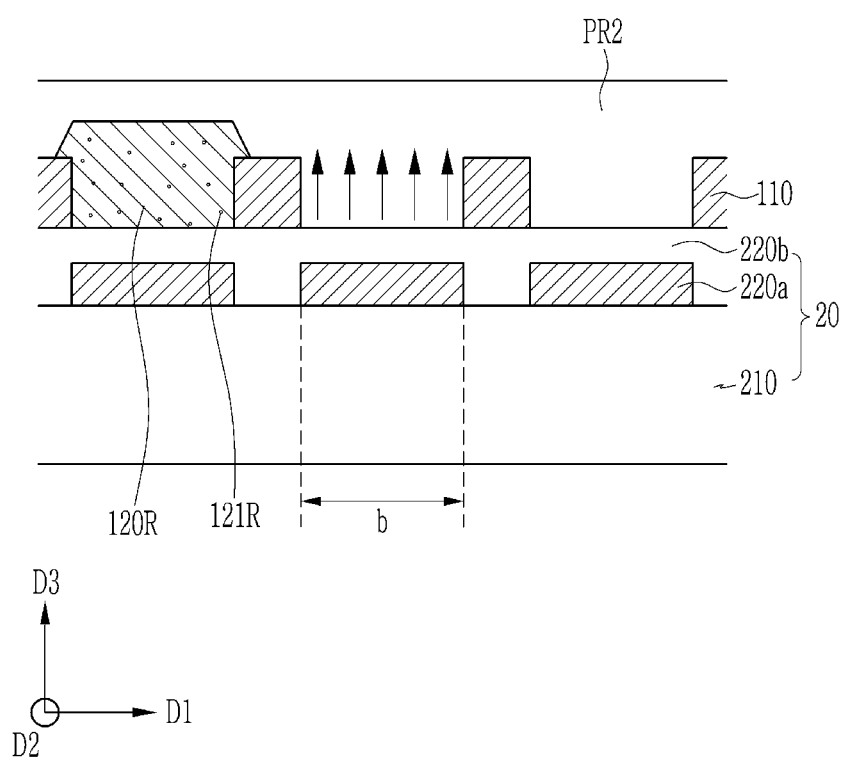

As shown in FIG. 8, a second photosensitive resin layer PR2 is provided or formed on the first color converting layer 120R, the light blocking member 110, and the passivation layer 220b. The light emitting element package 220a provided in the second area (b) of the substrate 210 is driven to generate and/or emit light (e.g., upward arrows in FIG. 8 at area (b)). The light emitting element package 220a may emit blue light, particularly a light with a center wavelength of about 430 nanometers to about 470 nanometers.

The second photosensitive resin layer PR2 overlapping the second area (b) of the substrate 210 may be hardened by the driving of the light emitting element package 220a provided in the second area (b) of the substrate 210.

The second photosensitive resin layer PR2 may include a photoinitiator which is activated by the light with the center wavelength. The second photosensitive resin layer PR2 may be a negative photosensitive resin, and the second photosensitive resin layer PR2 may be a second semiconductor nanocrystal 121G.

Figure 9:
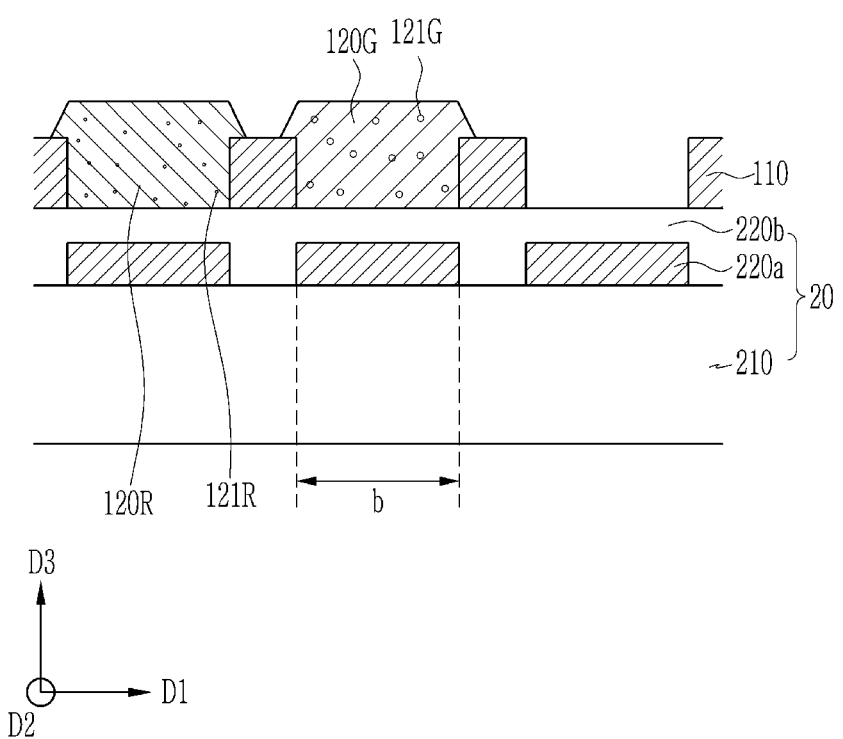

At the second area (b) of the substrate 210, the second color converting layer 120G may be provided or formed from a portion of the second photosensitive resin layer PR2 which hardened, as shown in FIG. 9, by removing an un-hardened portion of the second photosensitive resin layer PR2. The un-hardened portion of the second photosensitive resin layer PR2 may be a remaining portion thereof except for the hardened portion. The second color converting layer 120G may include a second semiconductor nanocrystal 121G.

Figure 10:
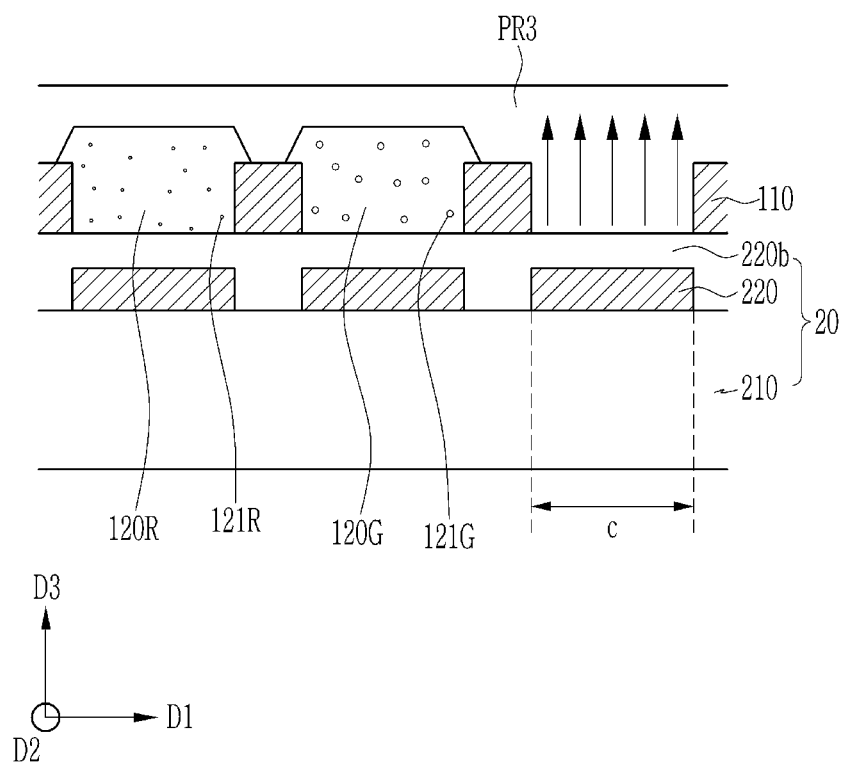

As shown in FIG. 10, a third photosensitive resin layer PR3 is provided or formed on the first color converting layer 120R, the second color converting layer 120G, the light blocking member 110, and the passivation layer 220b.

The light emitting element package 220a provided in a third area (c) of the substrate 210 is driven to generate and/or emit light (e.g., upward arrows in FIG. 10 at area (c)). The light emitting element package 220a may emit blue light, particularly light with the center wavelength of about 430 nanometers to about 470 nanometers.

The third photosensitive resin layer PR3 overlapping the third area (c) of the substrate 210 may be hardened by the driving of the light emitting element package 220a provided in the third area (c) of the substrate 210.

The third photosensitive resin layer PR3 may include a photoinitiator which is activated by the light with the center wavelength. The second photosensitive resin layer PR2 may be a negative photosensitive resin.

At the third area (c) of the substrate 210, the transmission layer 120B may be provided or formed from a portion of the third photosensitive resin layer PR3 which is hardened, as shown in FIG. 2, by removing an un-hardened portion of the third photosensitive resin layer PR3. The un-hardened portion of the third photosensitive resin layer PR3 may be a remaining portion thereof except for the hardened portion. The transmission layer 120B may include a transparent resin, and the light emitted by the light emitting element package 220a may be output without color-conversion as described above.

According to one or more exemplary embodiment of the method for manufacturing a display device, the first the color converting layer 120R, the second color converting layer 120G, and the transmission layer 120B may each be a hardened portion of a photosensitive resin layer, which is provided by the light irradiated from a rear side of the photosensitive resin layer. That is, the photosensitive resin layer may be hardened from a lower side thereof which is closest to the passivation layer 220b. The lower side may correspond to an interface respectively between the first color converting layer 120R and the passivation layer 220b, between the second color converting layer 120G and the passivation layer 220b, and between the transmission layer 120B and the passivation layer 220b.

According to one or more exemplary embodiment, respective interface adherence between the first color converting layer 120R and the passivation layer 220b, between the second color converting layer 120G and the passivation layer 220b, and between the transmission layer 120B and the passivation layer 220b may be excellent. The respective interface adherence between the first color converting layer 120R, the second color converting layer 120G, and the transmission layer 120B and the other constituent elements is excellent, so reliability of the display device may be improved. That is, light is provided from a side of the photosensitive resin layer at which an interface is provided or formed with other layers of the display device, like the passivation layer 220b.

In one or more exemplary embodiment, the first color converting layer 120R, the second color converting layer 120G, and the transmission layer 120B may be provided or formed without an additional exposure mask, so that the first color converting layer 120R, the second color converting layer 120G, and the transmission layer 120B may be discretely provided to have very narrow patterns.

According to one or more exemplary embodiment of the invention, the display device described with reference to FIG. 4 may be provided by a method of manufacturing a display device with reference to FIG. 6 through FIG. 9, coating a transparent resin on the first color converting layer 120R, the second color converting layer 120G, and the light blocking member 110 of FIG. 9, and hardening the transparent resin to provide or form the transmission layer 120B shown in FIG. 4.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
   a plurality of light emitting elements including a semiconductor light emitting chip, and the plurality of light emitting elements emits incident light;
   a color control layer disposed on the plurality of light emitting elements and including a plurality of first color converting patterns which color-convert the incident light to a first color light;
   the plurality of first color converting patterns respectively corresponding to a plurality of first light emitting elements among the plurality of light emitting elements; and
   the plurality of first light emitting elements which correspond to the plurality of first color converting patterns being electrically connected to each other.

2. The display device of claim 1, wherein
   the color control layer further includes a plurality of second color converting patterns which color-convert the incident light to a second color light,
   the plurality of second color converting patterns respectively correspond to a plurality of second light emitting elements among the plurality of light emitting elements, and
   the plurality of second light emitting elements which correspond to the plurality of second color converting patterns are electrically connected to each other.

3. The display device of claim 1, wherein
   the color control layer further includes a plurality of transmission patterns which transmit the incident light,
   the plurality of transmission patterns respectively correspond to a plurality of third light emitting elements among the plurality of light emitting elements, and
   the plurality of third light emitting elements which correspond to the plurality of transmission patterns are electrically connected to each other.

4. The display device of claim 1, wherein a planar area occupied by a single one light emitting element among the plurality of light emitting elements is less than a planar area occupied by a first color converting pattern among the plurality of first color converting patterns.

5. The display device of claim 1, wherein along a same direction, a width of a single one light emitting element among the plurality of light emitting elements is less than a width of a first color converting pattern among the plurality of first color converting patterns.

6. The display device of claim 4, wherein the incident light emitted by the single one light emitting element has a Lambertian distribution.

7. The display device of claim 1, wherein a ratio of a width to a thickness of a first color converting pattern among the plurality of first color converting patterns is about 4:1 to about 1:1.

8. The display device of claim 1, wherein each of the plurality of light emitting elements includes:
   a first conductive semiconductor layer;
   a second conductive semiconductor layer facing the first conductive semiconductor layer; and
   an active layer between the first conductive semiconductor layer and the second conductive semiconductor layer.

9. The display device of claim 1, further comprising a passivation layer respectively between the plurality of light emitting elements, and each of the plurality of the first color converting patterns.

10. A display device comprising:
   a plurality of light emitting elements including a semiconductor light emitting chip, and the plurality of light emitting elements emit incident light; and
   a color control layer disposed on the plurality of light emitting elements and including a plurality of first color converting patterns which color-convert the incident light to a first color light;
   the plurality of first color converting patterns respectively corresponding to a plurality of first light emitting elements among the plurality of light emitting elements;
   each of the plurality of first color converting patterns being formed column-like or plate-like on top surfaces of the corresponding plurality of first light emitting elements; and
   the plurality of first light emitting elements which correspond to the plurality of first color converting patterns being drivable simultaneously with each other.

11. A display device comprising:
   a plurality of light emitting elements including a semiconductor light emitting chip, and the plurality of light emitting elements emits incident light; and
   a color control layer disposed on the plurality of light emitting elements and including a plurality of first color converting patterns which color-convert the incident light to a first color light, and a light blocking member,
   the light blocking member defining areas where each of the plurality of first color converting patterns is disposed,
   the plurality of first color converting patterns respectively corresponding to a first light emitting elements among the plurality of light emitting elements; and
   the plurality of first light emitting elements which correspond to the plurality of first color converting patterns being electrically connected to each other.

\* \* \* \* \*